(12) United States Patent
Harrison et al.

(10) Patent No.: US 7,408,235 B2
(45) Date of Patent: Aug. 5, 2008

(54) QUANTUM COHERENT SWITCH UTILIZING COMMENSURATE NANOELECTRODE AND CHARGE DENSITY PERIODICITIES

(75) Inventors: Neil Harrison, Santa Fe, NM (US); John Singleton, Los Alamos, NM (US); Albert Migliori, Santa Fe, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 0 days.

(21) Appl. No.: 10/887,153

(22) Filed: Jul. 7, 2004

(65) Prior Publication Data

US 2005/0018275 A1 Jan. 27, 2005

Related U.S. Application Data

(60) Provisional application No. 60/485,370, filed on Jul. 8, 2003.

(51) Int. Cl.
*G02F 1/35* (2006.01)
(52) U.S. Cl. .................. 257/410; 257/39; 257/295; 257/E29.07; 257/E29.071; 257/E29.301; 359/108; 359/117
(58) Field of Classification Search ................ 257/295, 257/39, 410; 359/108, 117
See application file for complete search history.

(56) References Cited

U.S. PATENT DOCUMENTS

| 5,324,976 | A | * | 6/1994 | Williams | ............... 257/416 |
| 5,497,015 | A | * | 3/1996 | Ishibashi et al. | ............ 257/287 |
| 5,828,079 | A | * | 10/1998 | Mizuno et al. | ............... 257/39 |
| 6,724,056 | B1 | | 4/2004 | Blumberg et al. | |
| 6,735,073 | B2 | | 5/2004 | Blumberg | |
| 2007/0007568 | A1 | * | 1/2007 | Tanaka et al. | ............... 257/295 |

OTHER PUBLICATIONS

Kurita et al., "Field Modulation Effects on Charge-Density-Wave Conduction in NbSe.sub.3," Physica B, 284-288 (2000), pp. 1161-1662.*
Adelman, "FET modulation of charge density-wave transport in NbSe(3) and TaS(3)", The American Physical Society, 1995, pp. 5264-5267.*
Thorne, Charge-Density-Wave Conductors, Physics Today, p. 42, (May 1996).

* cited by examiner

*Primary Examiner*—Ahmed Sefer
(74) *Attorney, Agent, or Firm*—Ray G. Wilson; Juliet A. Jones

(57) ABSTRACT

A quantum coherent switch having a substrate formed from a density wave (DW) material capable of having a periodic electron density modulation or spin density modulation, a dielectric layer formed onto a surface of the substrate that is orthogonal to an intrinsic wave vector of the DW material; and structure for applying an external spatially periodic electrostatic potential over the dielectric layer.

13 Claims, 1 Drawing Sheet

QUANTUM COHERENT SWITCH UTILIZING COMMENSURATE NANOELECTRODE AND CHARGE DENSITY PERIODICITIES

RELATED APPLICATIONS

This application claims the benefit of the filing date of U.S. provisional application No. 60/485,370, filed Jul. 8, 2003, and incorporated herein for all purposes.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to electronic switches, oscillators, and amplifiers, and, more particularly, to quantum coherent electronic devices that are formed from materials that exhibit a density wave.

BACKGROUND OF THE INVENTION

Electronic switches, oscillators, and amplifiers are often formed using a field effect transistor (FET). The FET has three basic parts; a gate comprising a single metal pad, a thin insulating layer underneath the gate, and a channel, made from a semiconducting material, underneath the insulating layer. The application of a voltage to the gate results in an electric field that, depending on its sign, either accumulates carriers at the semiconductor-insulator interface or depletes them from this region. The former process increases the electrical conductivity of the semiconducting layer; the latter decreases it. These effects enable the FET to act as an amplifier or switch and enable it to be used as a component in an oscillator source producing oscillatory electrical currents or voltages.

The body of the FET is conventionally a doped semiconductor. The doping defines a necessary reference level against which the electric field provided by the gate acts. Technically, this is known as "pinning the Fermi energy of the semiconductor". Because a major change in the carrier density at the semiconductor-insulator interface is required for operation, the FET suffers from time lags due to the capacitance associated with the dopants and with moving the charge carriers within the thickness of the device. The operating speed of the FET is limited by associated effects: the carrier mobility and the capacitance of the depletion layer.

Another, less closely-related device is the bipolar transistor, which also acts as a switch, amplifier, or oscillator. In addition to being speed-limited by carrier mobility, it also relies on minority carriers and is limited in speed by carrier recombination times.

A recent improvement in FET technology is described in U.S. Pat. No. 6,724,056, issued Apr. 20, 2004, where the conventional dielectric material between the gate and the semiconductor material is formed from a charge or spin density wave (CDW or SDW, respectively, material). This device used the high value of the real part of the dielectric constant for these materials, i.e., the insulating value, to make the gate structure ultra-sensitive.

In accordance with the present invention, the semiconductor of a conventional FET is replaced by a charge or spin density wave (CDW or SDW, respectively) material, and, secondly, the continuous gate of a FET is replaced by periodic electrode structure or some other means of applying a periodically-varying electric field. In a CDW or SDW material, interactions between the conduction electrons result in the material spontaneously changing from a metal (i.e. an electrical conductor) to a quantum coherent state (the density wave) that is an electrical insulator. A defining characteristic of the latter insulating state is a periodically-modulated charge—(in the case of a CDW) or spin—(in the case of an SDW) density. The periodic electrode structure enables this process to be controlled through the application of a matching periodic electrostatic field that either destroys the density wave, or enhances its formation.

This results in an electronic device, called herein a "quantum coherent switch" (QCS) that may exhibit electrical switching action, amplification, or oscillation. Because the density-wave (DW) state is a cooperative phenomenon, i.e., an effectively instantaneous, self-reinforcing transition driven by the mutual interactions between the conduction electrons, the speed of the device is not limited by carrier recombination times, carrier mobility or capacitative effects. Moreover, the QCS does not require the use of a conventional semiconductor or the addition of doping. The periodic electrostatic field can be applied by an insulated periodic metallic gate electrode structure or by a standing electromagnetic wave, for instance within a resonant cavity.

One advantage inherent in the elimination of doping is that the QCS may be made arbitrarily small; in a conventional FET, a relatively large volume of doped semiconductor is required to adequately pin the Fermi energy. Another advantage is that, by exploiting the intrinsically long phase correlation length of DWs, the energy density involved in switching is much smaller than with conventional semiconductor devices, such as FETs. The required signal voltages are at least an order of magnitude smaller. Further, because the DW substrate material is subjected to a spatially modulated electric field, as opposed to one that is uniform, the total change in carrier concentration induced in the DW material is zero. Hence, there are no capacitative effects associated with moving large quantities of charge around. The switching speed will instead be determined by the frequency corresponding to the energy gap of the DW, which may greatly exceed 1 THz.

Because DW formation is a bulk cooperative phenomenon, the system is able to undergo abrupt transitions from metallic to insulating behavior (or vice versa) upon being subjected to only very weak perturbations. Such perturbations can be in the form of an electrostatic potential, or additionally a change in temperature or magnetic field; the timescale for such transitions will be determined by the characteristic quantum-mechanical energy scale of the DW, which will typically fall in the 10 s-100 s of THz frequency range.

The theory of density wave materials is well known; see, e.g., R. E. Thorne, Charge Density Wave Conductors, Phys. Today, p. 42 (May 1996) and references cited therein. U.S. Pat. No. 4,636,737, issued Jan. 13, 1987, to Bhattacharya et al., describes a device using a density wave material, where the oscillating properties of a charge density wave conductor are used to form a demodulation device. U. S. Pat. No. 6,735,073, issued May 11, 2004, describes capacitive devices using the high dielectric values of DW materials to yield high capacitance devices. These devices do not use a periodic spatial electrostatic potential applied to the material surface to provide switching or amplification.

Various objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

A quantum coherent switch having a substrate formed from a density wave (DW) material capable of having a periodic electron density modulation or spin density modulation, a dielectric layer formed onto a surface of the substrate that is orthogonal to an intrinsic wave vector of the DW material; and structure for applying an external spatially periodic electrostatic potential over the dielectric layer.

BRIEF DESCRIPTION OF THE DRAWINGS

The accompanying drawing, which is incorporated in and forms a part of the specification, illustrates an embodiment of the present invention and, together with the description, serves to explain the principles of the invention. In the drawing.

DETAILED DESCRIPTION

Figure 1:
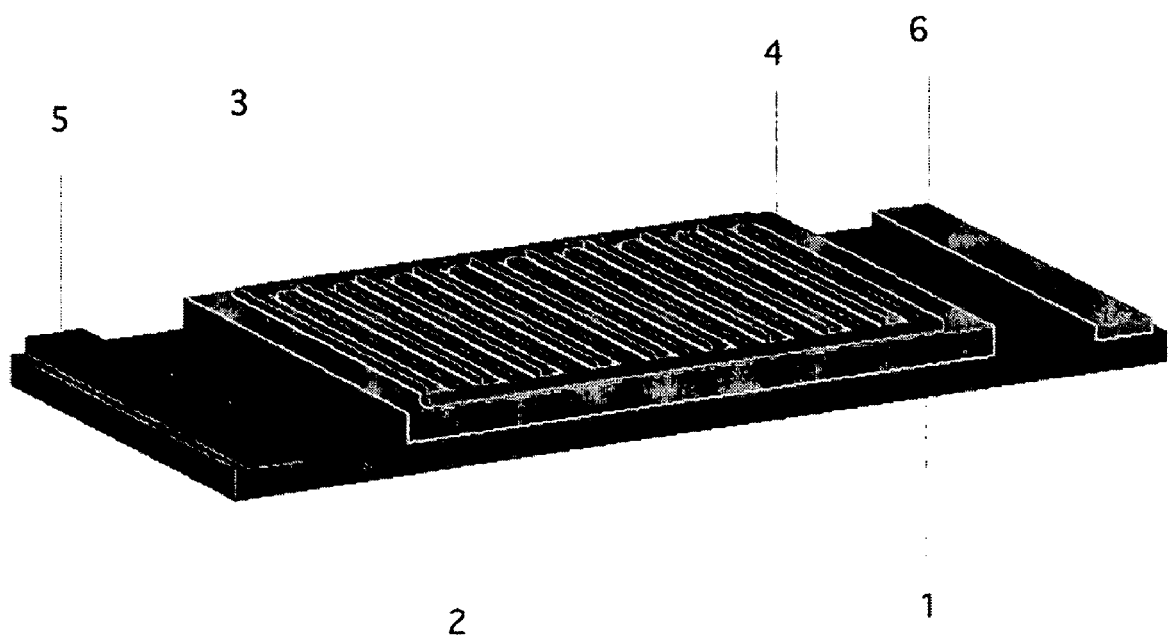
FIG. 1 is a schematic drawing of one embodiment of a QCS.

A QCS is provided by applying a periodic electrostatic electric field above the surface of a given crystal of a charge density wave (CDW) or spin density wave (SDW) material. In exemplary embodiments, a periodic electrostatic field is produced, e.g., by interleaved arrays of oppositely charged nanoelectrodes, or by placing the QCS in a resonant cavity where the wavelength of the confined electromagnetic radiation matches some multiple of the CDW periodicity. In the latter case, the electrostatic field, although spatially fixed, will oscillate in the temporal domain. Because the dielectric constant of the CDW or SDW is greater than that of vacuum, the wavelength of the electromagnetic radiation will be reduced, implying that frequencies relatively low compared to the limiting frequency of the QCS could be utilized. This could form the basis of amplification and controlled oscillation in the THz band, a region of the electromagnetic spectrum poorly served by solid-state sources at present.

Any DW system, or a system susceptible to forming a DW, has a periodicity in real space that corresponds to a specific wavevector in k-space (reciprocal lattice space). Because of this, the DW system is very sensitive to perturbations possessing this wavevector. This selectivity enables the DW to be robust to external random perturbations (e.g. temperature changes), but exquisitely tunable by only tiny adjustments of the correct wavevector. This wave-vector selectivity distinguishes the QCS from conventional semiconductor devices.

The topology of the QCS resembles a field effect transistor, with one important difference: in the present QCS, the "gate" has overall charge neutrality when the interleaved arrays of nanoelectrodes are oppositely charged. This is essential for maintaining the carrier concentration of the CDW (or SDW) substrate material at equilibrium. The source and drain electrodes are applied directly to the upper surface of the crystal on either side of the nanoelectrode "gate" in a similar manner as with field effect transistors. Additional electrodes can be positioned under the crystal for voltage biasing purposes.

As shown in FIG. 1, a thin single crystal of a CDW or SDW compound 1 is selected. A suitable dielectric material 2 (e.g., PMMA or aluminum oxide) is deposited onto a clean surface of the crystal that is orthogonal to the intrinsic wavevector of the CDW or SDW; this direction is chosen for maximum sensitivity. On top of dielectric material 2 a bipolar interdigitated gate with positive nanoelectrode 3 and negative nanoelectrode 4 is deposited. Source 5 and drain 6 electrodes are deposited directly on top of crystal 1 on either side of dielectric 2. Typical CDW and SDW materials that could be used are listed in Table 1 with relevant citations to the basic material properties. The gate signal can be dc voltage or an ac waveform of any form with a frequency as high as the device is able to support (see text below for the anticipated frequency limit).

TABLE 1

| Material | Ground state | Ordering temperature (K) | Citation |
| --- | --- | --- | --- |
| $(per)_2Au(mnt)_2$ | CDW | 11 | V. Gama et al., Synth Met. 55-57, 1677 (1993). |
| $\alpha\text{-}(BEDT\text{-}TTF)_2KHg(SCN)_4$ | CDW | 8 | P. Doury-Leylekian et al., Synth. Met. 137, 1271 (2003). |
| $(TMTSF)_2PF_6$ | SDW | 12 | K. Bechgaard et al., Solid State Commun. 33, 1119 (1980). |
| KCP | CDW | 189 | G. Grüner, Frontiers in Phys. vol. 89: Density Waves in Solids (Addison Wesley 1994). |
| $K_{0.3}MoO_3$ | CDW | 183 | G. Grüner, Frontiers in Phys. vol. 89: Density Waves in Solids (Addison Wesley 1994). |
| $TaS_3$ | CDW | 215 | G. Grüner, Frontiers in Phys. vol. 89: Density Waves in Solids (Addison Wesley 1994). |
| $NbSe_3$ | CDW | 145 & 59 | G. Grüner, Frontiers in Phys. vol. 89: Density Waves in Solids (Addison Wesley 1994). |
| $(TaSe_4)_2I$ | CDW | 263 | G. Grüner, Frontiers in Phys. vol. 89: Density Waves in Solids (Addison Wesley, 1994)]. |
| $(MDT\text{-}TTF)_2Au(CN)_2$ | SDW | 20 | G. Grüner, Frontiers in Phys. vol. 89: Density Waves in Solids (Addison Wesley 1994). |
| $(DMET)_2Au(CN)_2$ | SDW | 20 | G. Grüner, Frontiers in Phys. vol. 89: Density Waves in Solids (Addison Wesley 1994). |
| $Sr_{12}Cu_{24}O_{41}$ | CDW | 2100 | A. Gozar et al., preprint arXiv/cond-mat/0207219 |

The correlated-electron systems exhibiting CDW or SDW order (that arises inside crystal 1) are typically anisotropic molecular structures with large open unit cells of linear dimensions of order 1 nm. Some of the Fermi surfaces of these materials possess additional translational symmetry in k-space. Upon formation of a CDW or SDW below a characteristic ordering temperature, the electron system lowers its energy by mapping (nesting) these Fermi-surface sections onto each other, resulting in a charge or spin superstructure that enlarges the real-space unit cell to sizes approaching 10 nm. The resistivity can change by several orders of magnitude by way of a metal/insulator transition when the DW forms, whereby an energy gap $2\Delta$ opens on part or all of the Fermi surface (where $\Delta$ is the energy saved per electron, a quantity that is characteristic of the particular material). The energy gap and ordering temperature can be chosen for a particular application by selecting a specific material; ordering temperatures spanning two orders of magnitude are available.

A CDW groundstate consists of a spatial modulation of the electronic charge density in the bulk of the crystal accompanied by a commensurate shift in the positions of the ions that make up the crystalline lattice, brought about by electron-phonon coupling. Without this shift, the modulation of the charge density would otherwise give rise to an intrinsic spatial modulation of the electric field of order $5\times10^8$ $Vm^{-1}$. This ionic shift takes place purely for thermodynamic reasons as the crystal attempts to lower its free energy by compensating internal electrostatic forces. Since the extent to which this takes place may vary between compounds, the above voltage estimate should be considered as an absolute upper limit.

Whereas this modulation value provides an absolute upper limit estimate of the externally applied electrostatic modulation required to significantly perturb a CDW state (by applying a potential difference between electrodes 3 and 4), it is still dwarfed by the uniform electric field of $2\times10^9$ $Vm^{-1}$ that is typically required in semiconductor field effect transistor devices. In practice, the electric field required to cause a significant perturbation will be comparable to the energy ($\sim e\Delta$) per electron acquired on formation of the CDW phase. This corresponds to an electric field between $10^6$ and $10^8$ $Vm^{-1}$, depending on the material.

The stability of a CDW depends on the balance of energy between the electronic energy $\epsilon_{el}$ gained upon opening the energy gap and the elastic energy lost $\epsilon_{ph}$ by deforming the lattice. A CDW forms when $\epsilon_{el} > \epsilon_{ph}$. The role of the externally applied spatially modulated electric field (applied between electrodes 3 and 4) is then to alter this balance, potentially enabling a CDW to form in a system that is only just on the verge of forming one. This can be done by choosing a periodicity of modulation (i.e. the interdigital periodicity of electrodes 3 and 4) that either nearly matches or has Fourier components that are close to being commensurate with (i.e. having a related periodicity to) the nesting vector Q that is required to map the sections of the Fermi surface together. By having an oscillatory component that matches or almost matches the intrinsic periodicity length scale of the CDW/SDW material, the variations in electric field can couple directly to the charge degrees of freedom within the CDW/SDW material in an efficient coherent manner over a substantial area of the same time. Since the electrical conductivity decreases upon opening a gap (should a CDW form), this can be considered as a "normally on" device.

Another mode of operation is that where the externally applied spatially modulated electric field is discommensurate (i.e., has a different periodicity than) with that of a CDW that is already established. In this case the $\epsilon_{el}$ can actually be suppressed, causing the CDW to be destroyed or coerced into an excited state with different physical properties. This can be considered as the "normally off" device. Another possibility is to transmute a SDW into a CDW by using the periodic electric field to shift the phase of its up and down spin components relative to each other. In this way, the electric field provides the necessary coercion to form a charge modulation.

In all cases, the extent to which the newly ordered CDW phase propagates into the bulk from the surface depends on the proximity effect, in a similar manner to superconductivity, and on the degree to which the free energy is sensitive to the periodicity in all three spatial directions. The latter leads to very long correlation lengths at low temperatures in CDW and SDW systems within the bulk. The correlation length is the length scale over which periodicity and amplitude of the CDW or SDW is maintained due to local electrostatic interactions.

Fabrication.

In an exemplary embodiment of the invention using nanoelectrodes to provide the periodic electrostatics potential, a QCS may be fabricated with energetic neutral atom beam lithography (ENABL) 3. [Energetic neutral atom beam thin film materials chemistry, M. A. Hoffbauer, and J. C. Gregory, JC ABSTRACTS OF PAPERS OF THE AMERICAN CHEMICAL SOCIETY, 21, pt.1, p. U388-U388], as well as conventional electron beam lithography (EBL). ENABL allows insulating dielectrics such as aluminum oxide to be applied to the surface of "soft" materials. This is particularly important with some of the CDW and SDW materials formed from organic molecules of the TMTSF (tetramethyl tetraselena fulvalene) and BEDT-TTF (bis(ethylenedithio)tetrathiafulvalene) families. An alternative approach is to spin on PMMA (poly(methyl methacrylate)), or the like, as the dielectric barrier, although this leads to a considerably thicker layer of dielectric than does the ENABL technique. With ENABL, a thin layer of aluminum can be deposited and then oxidized in a desired pattern by subjecting it to energetic oxygen atoms.

Electron beam equipment and processes are conventionally available for providing lithography at dimensions suitable for integrated circuits and nanometer scale devices. See, e.g., U.S. Pat. No. 5,786,601, issued Jul. 28, 1998, and U.S. Pat. No. 5,879,869, issued Mar. 9, 1999, incorporated herein by reference.

A number of approaches can be used for generating nanoelectrodes with periodicities below 10 nm. One is to use nanoparticle arrays as a template for etching a desired structure either into the dielectric or directly into gold or copper deposited on top of the dielectric. Because of their heavy mass and charge neutrality (compared to electrons), neutral atom beams are effectively diffractionless and do not suffer from Coulombic proximity effects when projected through an array to etch a desired pattern. The combination of ENABL and nanoparticle arrays allows the formation of grid-like structures, which are less prone to errors than nanowires.

A second simple gate of opposite charge polarity can then be applied over another layer of dielectric in order to remove the uniform component to the electric field (FIG. 1). Another approach is to produce an interleaved fine-tooth comb structure using EBL and then use this as a template inclined at an angle to obtain progressively finer and finer pitches. Again, this approach relies on the absence of notable diffraction and Coulombic proximity effects with neutral atom beams.

The topology of the QCS resembles a field effect transistor, with one important difference: in the present quantum coherent switching QCS, the "gate" has overall charge neutrality when the interleaved arrays of nanoelectrodes are oppositely charged. This is essential for maintaining the carrier concentration of the CDW (or SDW) substrate material at equilibrium. The source and drain electrodes are to be applied directly to the upper surface of the crystal on either side of the nanoelectrode "gate" in a similar manner as with field effect transistors. Additional electrodes can be positioned under the crystal for voltage biasing purposes.

The foregoing description of the invention has been presented for purposes of illustration and description and is not intended to be exhaustive or to limit the invention to the precise form disclosed, and obviously many modifications and variations are possible in light of the above teaching.

The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A quantum coherent switch comprising:
   (a) substrate formed from a density wave (DW) material having a periodic electron density modulation or spin density modulation;
   (b) a dielectric layer on a surface of the substrate; and
   (c) a means for applying an external spatially periodic electrostatic potential over the dielectric layer, wherein said means for applying an external spatially periodic electrostatic potential comprises at least one nanoelectrode.

2. The quantum coherent switch of claim 1, where the DW material is a charge density wave material.

3. The quantum coherent switch of claim 1, where the DW material is a spin density wave material.

4. The quantum coherent switch of claim 1, where the means for applying an external electrostatic potential comprises two nanoelectrodes applied to the dielectric layer.

5. The quantum coherent switch of claim 4, where the nanoelectrodes form an interleaved array of nanoelectrodes.

6. The quantum coherent switch of claim 5, wherein the interleaved nanoelectrodes comprise a positive electrode and a negative electrode.

7. The quantum coherent switch of claim 1, where the spatially periodic electrostatic potential has a periodicity that is an integral multiple of the periodic electron density modulation of the DW material.

8. The quantum coherent switch of claim 7, wherein the periodicity is less than 10 nm.

9. The quantum coherent switch of claim 1, wherein the DW material comprises a material selected from the group consisting of alpha-$(BETD-TTF)_2KHg(SCN)_4$, $(per)_2Au(mnt)_2$, KCP, $K_{0.3}MoO_3$, $TaS_3$, $NbSe_3$, $(TaSe_4)_2$, $Sr_{12}Cu_{24}O_{41}$, and mixtures thereof.

10. The quantum coherent switch of claim 9, wherein the DW material is $(per)_2Au(mnt)_2$.

11. The quantum coherent switch of claim 1, wherein the dielectric layer comprises a material selected from the group consisting of aluminum oxide, poly(methyl)methacrylate, and mixtures thereof.

12. The quantum coherent switch of claim 11, wherein the dielectric layer is poly(methyl)methacrylate.

13. The quantum coherent switch of claim 1 wherein the spatially periodic electrostatic potential has a periodicity that is different than the periodic electron density modulation of the DW material.

* * * * *